United States Patent
Wittmann et al.

(10) Patent No.: US 10,470,325 B2
(45) Date of Patent: *Nov. 5, 2019

(54) MEDIA-TIGHT CONTROL DEVICE FOR A MOTOR VEHICLE

(71) Applicant: CPT Zwei GmbH, Hannover (DE)

(72) Inventors: Frieder Wittmann, Heilsbronn (DE); Karin Beart, Lauf an der Pegnitz (DE); Johannes Bock, Erlangen (DE); Thomas Schmidt, Burglengenfeld (DE); Bernhard Schuch, Neusitz (DE)

(73) Assignee: CPT ZWEI GMBH, Hannover (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,433

(22) Filed: Mar. 14, 2018

(65) Prior Publication Data
US 2018/0206356 A1 Jul. 19, 2018

Related U.S. Application Data

(63) Continuation of application No. PCT/EP2016/069392, filed on Aug. 16, 2016.

(30) Foreign Application Priority Data

Sep. 15, 2015 (DE) .................. 10 2015 217 572

(51) Int. Cl.
*H05K 5/00* (2006.01)
*H05K 7/00* (2006.01)
(Continued)

(52) U.S. Cl.
CPC ............ *H05K 5/065* (2013.01); *H05K 1/142* (2013.01); *H05K 1/181* (2013.01); *H05K 5/0017* (2013.01);
(Continued)

(58) Field of Classification Search
CPC ......... H05K 2201/0999; H05K 9/0024; H05K 9/0052; H05K 9/0071; H05K 9/0081;
(Continued)

(56) References Cited

U.S. PATENT DOCUMENTS

| 7,109,410 B2* | 9/2006 | Arnold et al. .......... H01L 21/50 174/390 |
| 2012/0092842 A1* | 4/2012 | Neumeister et al. ....................... H01L 2224/48091 361/761 |

(Continued)

FOREIGN PATENT DOCUMENTS

CN 201894009 U 7/2011
CN 202857192 U 4/2013
(Continued)

OTHER PUBLICATIONS

International Search Report and Written Opinion dated Oct. 21, 2016 from corresponding International Patent Application No. PCT/EP2016/069392.
(Continued)

*Primary Examiner* — Binh B Tran

(57) ABSTRACT

The disclosure relates to a control device in a motor vehicle. The control device includes a housing cover with a peripheral edge region, and a planar, electrical connecting apparatus with integrated conductor tracks. The housing cover, in the edge region, is cohesively connected at least to the connecting apparatus and forms a cavity with the connecting apparatus. The control device also includes at least one electronic component within the cavity. The connecting apparatus electrically connects the at least one electronic component to electronic components outside the cavity. The peripheral edge region is encapsulated by injection molding in a media-tight manner by a polymer at least in the region
(Continued)

of the connecting seam between the housing cover and the connecting apparatus.

11 Claims, 3 Drawing Sheets

(51) Int. Cl.
| | |
|---|---|
| *H05K 1/18* | (2006.01) |
| *H05K 5/06* | (2006.01) |
| *H05K 1/14* | (2006.01) |
| *H05K 5/02* | (2006.01) |
| *H05K 5/03* | (2006.01) |
| *H05K 9/00* | (2006.01) |
| *H01L 21/56* | (2006.01) |

(52) U.S. Cl.
CPC ......... *H05K 5/0082* (2013.01); *H05K 5/0247* (2013.01); *H05K 5/03* (2013.01); *H01L 21/56* (2013.01); *H05K 1/189* (2013.01); *H05K 9/0024* (2013.01); *H05K 9/0052* (2013.01); *H05K 9/0071* (2013.01); *H05K 9/0081* (2013.01); *H05K 2201/0707* (2013.01); *H05K 2201/0999* (2013.01); *H05K 2201/1003* (2013.01); *H05K 2201/10015* (2013.01); *H05K 2201/10287* (2013.01); *H05K 2201/10371* (2013.01); *H05K 2201/10522* (2013.01)

(58) Field of Classification Search
CPC .. H05K 2201/0707; H05K 2201/10371; H01L 21/56; H01L 23/28; H01L 31/0203; H01L 31/048; H01L 33/52
USPC ....... 361/748, 752, 753, 760, 761, 782, 783, 361/784, 790, 816–818; 174/521; 257/787, 788, 793
See application file for complete search history.

(56) References Cited

U.S. PATENT DOCUMENTS

| | | | |
|---|---|---|---|
| 2015/0173227 A1* | 6/2015 | Ott et al. | ............... H05K 3/383 |
| | | | 361/728 |
| 2018/0206355 A1 | 7/2018 | Wittmann et al. | |

FOREIGN PATENT DOCUMENTS

| | | |
|---|---|---|
| CN | 103108515 A | 5/2013 |
| CN | 203482548 U | 3/2014 |
| CN | 104025284 A | 9/2014 |
| DE | 102006050351 A1 | 5/2008 |
| DE | 102007038331 A1 | 2/2009 |
| DE | 102010062653 A1 | 6/2012 |
| DE | 102011082537 A1 | 3/2013 |
| DE | 102012213917 A1 | 2/2014 |
| DE | 102013215230 A1 | 2/2015 |
| EP | 0383025 A1 | 8/1990 |
| EP | 2704544 A2 | 3/2014 |
| JP | 2014063867 A | 4/2014 |
| WO | 2005069462 A | 1/2005 |

OTHER PUBLICATIONS

German Office Action dated Jun. 14, 2016 for corresponding German Patent Application No. 10 2015 217 572.3.
Office Action dated Dec. 31, 2018 for U.S. Appl. No. 15/921,383, Publication No. US 2018/0206355.
Japanese Office Action dated Feb. 26, 2019 for corresponding Japanese application No. 2018-513439.
Chinese Office Action dated Jul. 29,2019 for corresponding Chinese Application No. 201680050584.0.

* cited by examiner

MEDIA-TIGHT CONTROL DEVICE FOR A MOTOR VEHICLE

CROSS-REFERENCE TO RELATED APPLICATIONS

This application claims the benefit of PCT Application PCT/EP2016/069392, filed Aug. 16, 2016, which claims priority to German Application DE 10 2015 217 572.3, filed Sep. 15, 2015. The disclosures of the above applications are incorporated herein by reference.

TECHNICAL FIELD

The disclosure relates to a control device for a motor vehicle, such as a media-tight control device.

BACKGROUND

In motor vehicle technology, components such as transmission systems, engine systems or brake systems are increasingly being primarily controlled electronically. This involves a development toward integrated mechatronic control systems, that is to say for integrated control electronics and the associated electronic components such as sensors or valves into the transmission, the engine or the brake system. Therefore, control devices generally have a large number of electronic components which are connected to other components outside the control device. In the case of "on-site electronics systems" of this kind, these control systems are no longer accommodated in a separate protected electronics compartment and therefore have to withstand corresponding environmental influences and mechanical, thermal and chemical loads. For this purpose, they are normally inserted into special housings.

An electronic connection from the inside of the housing to the outside of the housing is needed in order to allow a reliable connection to components which are positioned outside the housing.

The circuit carriers for control systems of this kind are generally constructed, introduced into a housing and this housing is then closed. An example of this is described in DE 10 2007 038 331 A1. However, this housing structure does not guarantee absolute leak-tightness against diffusion and/or permeation. Over the course of time, harmful gases can reach the circuit carrier and lead to corrosion of metal.

In an alternative design, the entire circuit structure for protecting the circuit carrier is completely encapsulated with a molding composition. An example of this is described in DE 10 2011 082 537 A1. The process management of the molding process has to be precisely complied with in this case. Otherwise, if unhoused electronic components, so-called bare dies, which are electrically connected to the circuit carrier by gold wire connections are used, so-called bonding wire drifting phenomena may occur. Furthermore, the coefficient of thermal expansion of the molding material has to be precisely matched to the entire structure comprising carrier substrate, components etc. Otherwise gaps may form between the molding composition and the structure under temperature loads.

A further possible way of sealing off the circuit chamber is welding the housing to a stainless steel cover. This method is comparatively costly and the electrical connections have to be routed from the circuit carrier, through the stainless steel housing, to the outside, in particular via glass bushings. Faults in the process can easily occur in this case. Furthermore, gases which are produced in the interior of the housing by the welding process can be discharged again only with difficulty.

SUMMARY

The disclosure provides a control device for a motor vehicle. The control device offers complete protection of the circuit and the circuit carrier against harmful gases and against aggressive media such as transmission oil, and at the same time leads to a reduction in production costs in comparison to previously known control devices.

The control device includes a housing cover with a peripheral planar edge region and a planar, electrical connecting apparatus with integrated conductor tracks. The housing cover, in the edge region, is cohesively connected at least in sections to the connecting apparatus so as to form a connecting seam and forms a cavity with the connecting apparatus. The cohesive connection between the housing cover and the connecting apparatus is established, for example, by adhesive bonding, lamination, or soldering.

On the connecting apparatus, at least one electronic component is arranged within the cavity, and the connecting apparatus electrically connects this electronic component to electronic components outside the cavity. In this case, the peripheral edge region of the housing cover is encapsulated by injection molding in a media-tight manner with a polymer at least in the region of the connecting seam between the housing cover and the connecting apparatus, where the housing cover is, in some examples composed of plastic or of metal, and the polymer is designed predominantly as molding material, as adhesive or resin.

The electronic components include, for example, capacitors, coils or a microprocessor. The electronic components are generally electrically connected to one another by conductor tracks of the connecting apparatus and/or by bonded gold wires.

The housing cover protects the electronic components in the interior of the control device housing against oils, such as aggressive oils, and also harmful gases and chemicals. Furthermore, the electronic components are protected against salts or processing residues. The oils, gases, salts and/or residues are present, for example, in a transmission on which or within which the control device is arranged. The corresponding conductor tracks are also protected by the housing cover. To this end, the cover, as already mentioned, is connected in a cohesive manner to the connecting apparatus in the edge region such that, together with the connecting apparatus, a closed-off cavity is formed around the electronic components. In addition, the peripheral edge region of the housing cover is encapsulated by injection molding with a polymer at least in the region of the connecting seam between the housing cover and the connecting apparatus, and therefore, the control device structure is hermetically sealed off from the surrounding area.

In contrast to covers which are connected in an interlocking manner, no fluids and/or gases can enter the cavity. Therefore, the electronic components are sealed and sealed off from the environment. In addition, rubber-like seals which are used, for example, in covers which are attached in an interlocking manner can be dispensed with. These seals would not guarantee complete gas-tightness since the gases can diffuse through seals of this kind to a considerable extent over the course of time.

For example, the chemicals or gases include sulfur compounds, as a result of which sulfides can be produced. Sulfides are at least partially electrically conductive and would form deposits on unprotected electronic components, the conductor tracks of the connecting operators and/or the gold wires. This may result in chemical reactions with the sulfides. For example, the conductor tracks of the connecting apparatus, such as silver conductor tracks, oxidize with the sulfur compounds. In this case, line resistances and/or functions of the electronic components can change and negatively influence, for example, the shifting behavior of a transmission. Furthermore, gases of this kind can cause changes in signal, so that, for example, the control device apparatus makes incorrect evaluations.

Therefore, overall, the service life and the accuracy of the control device are improved by the described structure. Furthermore, the described control device can be implemented as a prefabricated module for an on-site application, such as in the transmission or as an add-on control device for example.

In some implementations, the connecting apparatus is designed as a printed circuit board with at least one layer. The printed circuit board is, for example, a fiber-reinforced plastic printed circuit board or a ceramic printed circuit board. However, an HDI (High Density Interconnect) printed circuit board which is of very compact configuration could also be used. Here, the continuous printed circuit board projects beyond the entire peripheral edge region of the housing cover and at the same time forms the base of the housing. This results, for example, in a planar structure of the control device.

In order to additionally reinforce this structure or to compensate for a curvature of the structure in the region of the printed circuit board, which curvature occurs under certain circumstances, polymer can be additionally sprayed onto that side of the printed circuit board which is facing away from the housing cover in the region which corresponds to the connecting seam.

In order to reduce or to equalize the difference in level between the edge region of the cover and the printed circuit board in the region of the injection-molded encapsulation, the peripheral edge region of the housing cover runs in a corresponding peripheral groove in the printed circuit board. As a result, the risk of a gap forming in the injection-molded encapsulation in the region of the connecting point is reduced.

In some implementations, the connecting apparatus is arranged in part as a separate circuit carrier in the interior of the cavity, where the at least one electronic component, such as capacitor, coil or microprocessor, is arranged on the separate circuit carrier. The electronic components are electrically connected to one another, for example, by conductor tracks of the circuit carrier and/or by bonded gold wires. The separate circuit carrier is, for example, a fiber-reinforced plastic printed circuit board or a ceramic printed circuit board with one or more layers in each case. However, as an alternative, an HDI (High Density Interconnect) printed circuit board which is of very compact configuration for construction-related reasons could also be used.

The at least one electronic component on the separate circuit carrier may be electrically connected to electronic components outside the cavity by a separate printed circuit board. The separate printed circuit board used is, for example, a flexible printed circuit board which is formed over the entire surface area, with a cutout for receiving the separate circuit carrier, or is of strip-like design. In this example, the separate circuit carrier and the separate printed circuit board are arranged on a common carrier plate which projects beyond the entire peripheral edge region of the housing cover. Here, the cavity in the control device is substantially surrounded by the housing cover and the carrier plate. In general, the carrier plate is manufactured from a metal, such as aluminum, because of its stiffness and heat dissipation capability. If the separate printed circuit board used is a flexible film or foil, it may be laminated onto the carrier plate. If the flexible printed circuit board is formed over the entire surface area with a cutout for receiving the circuit carrier, the flexible printed circuit board is substantially overlapped over the entire periphery by the edge region of the housing cover. If the flexible printed circuit board is of strip-like design, the flexible printed circuit board is only partially covered by the peripheral edge region of the housing cover generally transversely to the conductor tracks.

In some implementations, the peripheral edge region of the housing cover runs in a corresponding peripheral groove in the carrier plate. As a result, the difference in level between the edge region of the cover and the carrier plate in the region of the injection-molded encapsulation is reduced or even equalized, and therefore the risk of a gap forming in the polymer in the region of the connecting seam is reduced.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
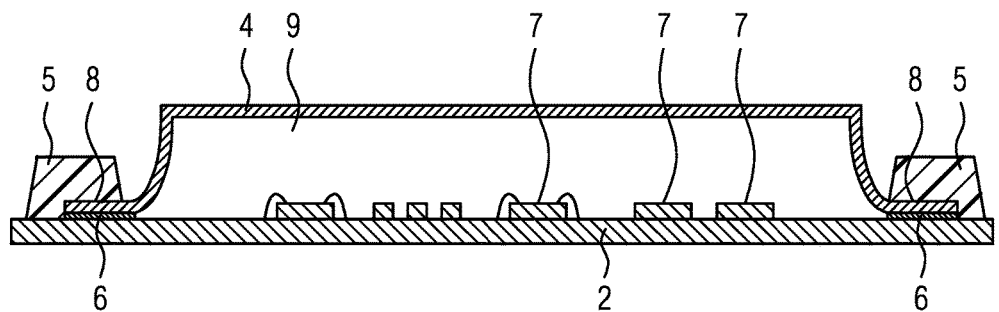
FIG. 1 shows a section through a control device having a continuous printed circuit board as the connecting apparatus.
Figure 2:
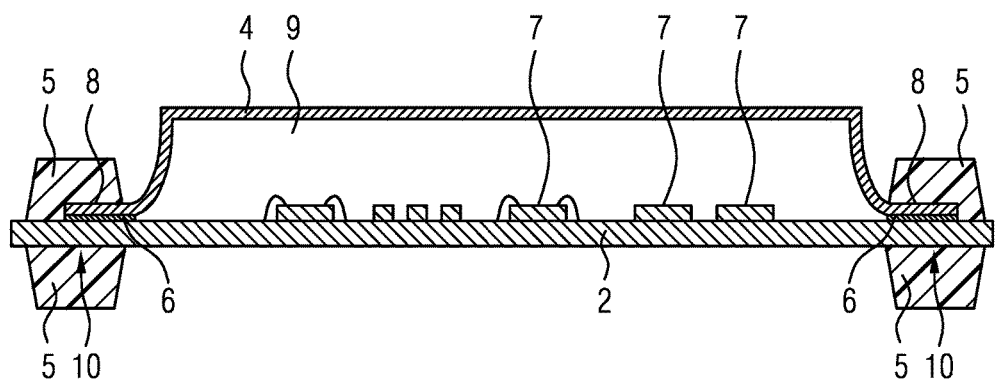
FIG. 2 shows a control device as in FIG. 1, with polymer applied to both sides.
Figure 3:
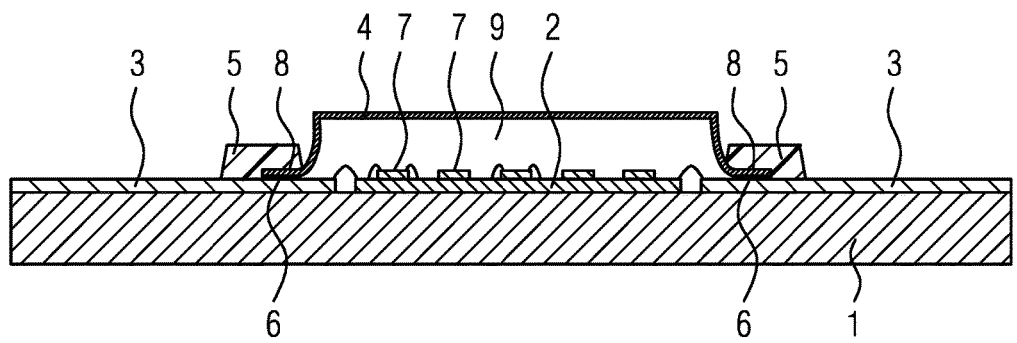
FIG. 3 shows a section through a control device having a separate circuit carrier and a separate printed circuit board.
Figure 5:
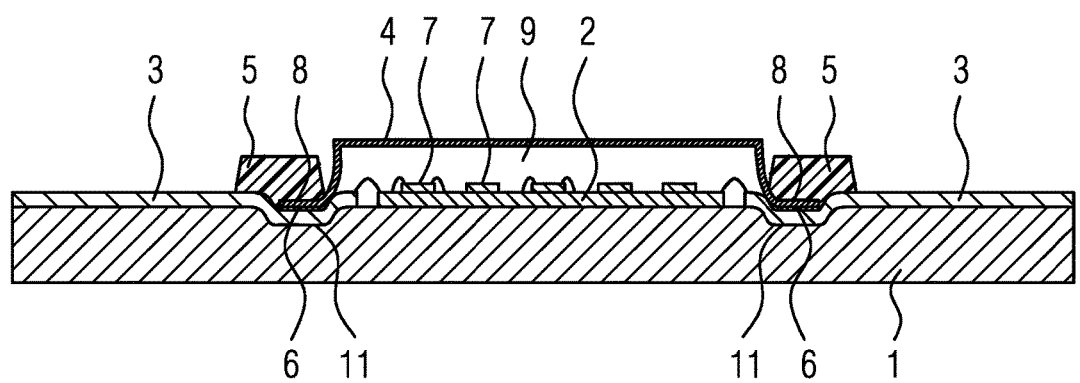
FIG. 5 shows a control device as in FIG. 3, but with a groove in the carrier plate.

FIGS. 1 and 2 and, respectively, 3 and 5 show schematic side views of a control device according to two different design principles, where FIG. 1 and FIG. 2 show the first design principle and FIGS. 3 and 5 show the second design principle. First of all, the common features of the two design principles will be described, before the differences are discussed.

In some implementations, a control device of an automatic transmission of a motor vehicle evaluates measurement values from sensors, such as Hall sensors, and controls shifting of the automatic transmission based on the measurement values. As an alternative, the control device may also be used for other purposes, such as in an engine of a motor vehicle for example.

Each control device has a connecting apparatus 2, 3. A plurality of electronic components 7 are arranged on the connecting apparatus 2, 3. In some examples, the electronic components include capacitors, coils, at least one microprocessor and/or other components. The electronic components 7 are electrically connected to one another, for example, by bonded gold wires and/or conductor tracks of the connecting apparatus 2, 3.

In order to protect the electronic components 7 and the corresponding conductor tracks, a gas-impermeable housing cover 4, in its edge region 8, is connected in a cohesive manner to the connecting apparatus 2, 3 so as to form a peripheral connecting seam 6. The cohesive connection between the housing cover 4 and the connecting apparatus 2, 3 is established by adhesive bonding. However, this connection can also be realized by lamination or soldering for example. The housing cover 4 is selectively manufactured from metal or plastic.

The housing cover 4 and the connecting apparatus 2, 3 enclose a closed-off cavity 9. Therefore, the cohesive connecting seam 6 is formed around the electronic components 7 in a coherent manner between the housing cover 4 and the connecting apparatus 2, 3.

The connecting apparatus 2, 3 electrically connects the electronic components 7 in the interior of the control device to electronic components, not shown here, outside the cavity 9 or control device. In this case, the peripheral edge region 8 of the housing cover 4 is encapsulated by injection molding with a polymer 5 at least in the region of the connecting seam 6 between the housing cover 4 and the connecting apparatus 2, 3, for example, in such a way that the edge region 8 is substantially completely covered by the polymer 5 in the direction of the cover 4 over the width of the edge region 8. In addition, the polymer 5 extends, beyond the edge region 8 in the opposite direction, facing away from the housing cover 4, extending over the connecting apparatus 2, 3, for example, at least over the same width. The width of the injection-molded encapsulation depends, amongst other things, on the type of polymer used and on the surface condition of the areas which are encapsulated by injection molding. For example, the edge region 8 and the connecting apparatus 2, 3 can each be of planar design, or each have a corresponding structure which, in the assembled state, lead to improved strength and leak-tightness of the connection, primarily over the service life. This ensures that the region of the connecting seam 6 between the housing cover 4 and the connecting apparatus 2, 3 is sufficiently covered with the polymer material 5, and therefore the control device structure is hermetically sealed off from the surrounding area, for example oils, such as aggressive oils, and also harmful gases and chemicals. The polymer 5 is designed as a molding material, or alternatively thereto as an adhesive or as a resin.

The differences between the two design principles according to FIGS. 1 to 5 will be explained in the text which follows.

In the example shown in FIG. 1, the connecting apparatus is designed as a printed circuit board 2 with at least one layer. The printed circuit board 2 is, for example, a fiber-reinforced plastic printed circuit board, a ceramic printed circuit board or an HDI printed circuit board. Here, the continuous printed circuit board 2 projects beyond the entire peripheral edge region 8 of the housing cover 4 and at the same time forms the base of the control device housing. This results, for example, in a planar structure of the control device.

In order to additionally reinforce the control device structure or to compensate for a curvature of the structure in the region of the printed circuit board 2, which curvature occurs under certain circumstances, polymer 5 may be additionally sprayed onto that side of the printed circuit board 2 which is facing away from the housing cover 4 in the region 10 which corresponds to the connecting seam 6, as shown in FIG. 2.

In the example shown in FIG. 3, the connecting apparatus 2, 3 includes a separate circuit carrier 2, on which all of the electronic components 7 are arranged, and a separate printed circuit board 3 by means of which the electronic components 7 in the interior of the control device are electrically connected to electronic components, not shown, outside the control device. The separate circuit carrier 2 and the separate printed circuit board 3 are connected by bonding wires here. The separate circuit carrier 2 and the separate printed circuit board 3 are arranged on a common carrier plate 1 which projects beyond the entire peripheral edge region 8 of the housing cover 4. Here, the cavity 9 is substantially surrounded by the housing cover 4 and the carrier plate 1.

In some examples, the separate circuit carrier 2 is designed as a fiber-reinforced plastic printed circuit board or, alternatively, as a ceramic printed circuit board or HDI printed circuit board with one or more layers in each case. However, other examples of a circuit carrier can also be used. The electronic components 7 are electrically connected to one another, for example, by bonded gold wires and/or conductor tracks of the separate circuit carrier 2.

The separate printed circuit board 3 used, may be a flexible printed circuit board which is composed of polyimide. This flexible printed circuit board 3 is designed either as a closed area, with a cutout for receiving the circuit carrier 2, or is of strip-like design.

In some examples, the carrier plate is manufactured from a metal, such as aluminum, because of its rigidity and heat dissipation requirements. The separate circuit carrier 2 and the separate printed circuit board 3 are usually adhesively bonded or laminated onto the carrier plate 1. If the flexible printed circuit board 3 is formed over the entire surface area, the flexible printed circuit board is substantially overlapped over the entire periphery by the edge region 8 of the housing cover 4.

If the flexible printed circuit board 3 is of strip-like design, the flexible printed circuit board is overlapped only in sections, generally transversely to the conductor tracks of the printed circuit board 3, by the peripheral edge region 8 of the housing cover 4 as a result of its design. The connecting seam 6 therefore extends over the peripheral edge region 8 on one side and over the strips of the printed circuit board 3 or over the carrier plate 1 on the other side.

FIG. 5 shows a control device as in FIG. 3, but the peripheral edge region 8 of the housing cover 4 runs in a corresponding peripheral groove 11 in the carrier plate 1. As a result, the difference in level between the edge region 8 and the carrier plate 1 in the region of the injection-molded encapsulation (i.e., polymer 5) is reduced or equalized, and therefore the risk of a gap forming in the polymer 5 in the region of the connecting seam 6 is reduced.

A groove of this kind would accordingly be feasible in the printed circuit board 2 in the first design principle according to FIGS. 1 and 2 too.

Figure 4:
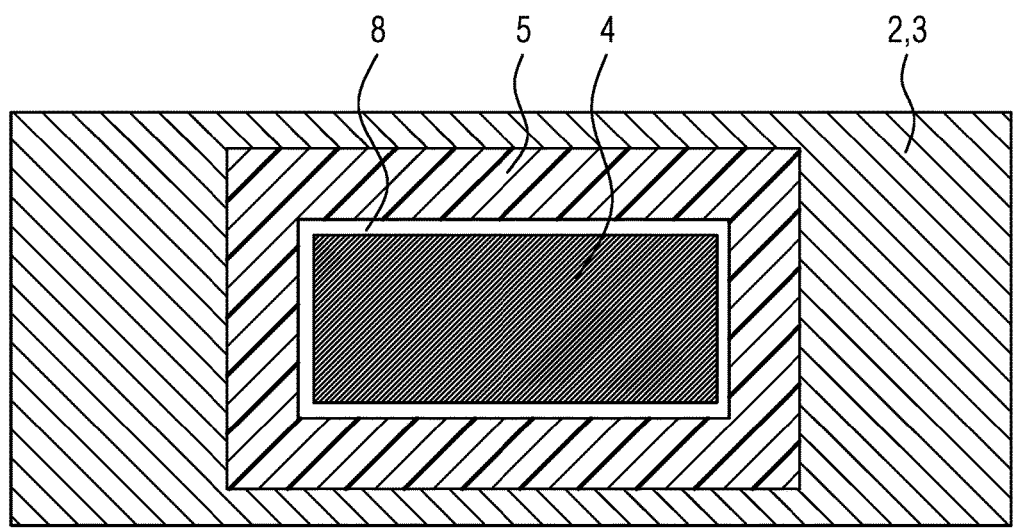
FIG. 4 shows a plan view of a control device.

FIG. 4 shows a plan view of a control device according to the two design principles. The housing cover 4 is arranged on the connecting apparatus 2, 3. The peripheral edge region 8 of the housing cover is encapsulated by injection molding in a media-tight manner with a polymer 5.

A number of implementations have been described. Nevertheless, it will be understood that various modifications may be made without departing from the spirit and scope of the disclosure. Accordingly, other implementations are within the scope of the following claims.

What is claimed is:
1. A control device in a motor vehicle, comprising:
   a housing cover including a peripheral edge region:
   a planar, electrical connecting apparatus with integrated conductor tracks;
   a connecting seam formed by cohesively connecting the edge region of the housing cover to the connecting apparatus so as to form the connecting seam, the housing cover forms a cavity with the connecting apparatus;

at least one electronic component within the cavity, wherein the at least one electronic component is electrically connected to electronic components outside the cavity by way of the connecting apparatus; and a polymer encapsulating the region of the connecting seam between the housing cover and the connecting apparatus by injection molding in a media-tight manner, wherein the connecting apparatus is designed as a separate circuit carrier in an interior of the cavity, wherein the at least one electronic component which is electrically connected to electronic components outside the cavity by a separate printed circuit board is arranged on the separate circuit carrier, and wherein the separate circuit carrier and the separate printed circuit board are arranged on a common carrier plate which projects beyond the peripheral edge region of the housing cover.

2. The control device of claim 1, wherein the connecting apparatus is designed as a printed circuit board with at least one layer, the printed circuit board projects beyond the peripheral edge region of the housing cover.

3. The control device of claim 2, wherein polymer is additionally sprayed onto that side of the printed circuit board which is facing away from the housing cover in the region which corresponds to the connecting seam.

4. The control device of claim 2, wherein the peripheral edge region of the housing cover runs in a peripheral groove in the printed circuit board.

5. The control device of claim 1, wherein the separate printed circuit board is designed as a flexible printed circuit board.

6. The control device of claim 1, wherein the separate printed circuit board is overlapped at least in sections by the peripheral edge region.

7. The control device of claim 1, wherein the carrier plate is composed of metal.

8. The control device of claim 1, wherein the peripheral edge region of the housing cover runs in a peripheral groove in the carrier plate.

9. The control device of claim 1, wherein the polymer is designed as molding material, as adhesive or resin.

10. The control device of claim 1, wherein the housing cover is composed of plastic or of metal.

11. The control device of claim 1, wherein the cohesive connection between the housing cover and the connecting apparatus is established by adhesive bonding, lamination or soldering.

* * * * *